United States Patent [19]
Gill et al.

[11] Patent Number: 5,661,060
[45] Date of Patent: Aug. 26, 1997

[54] METHOD FOR FORMING FIELD OXIDE REGIONS

[75] Inventors: Manzur Gill, Saratoga; Etan Shacham, Cupertino, both of Calif.

[73] Assignee: National Semiconductor Corporation, Santa Clara, Calif.

[21] Appl. No.: 365,210

[22] Filed: Dec. 28, 1994

[51] Int. Cl.$^6$ ............................................. H01L 21/70
[52] U.S. Cl. ........................ 438/257; 438/261; 438/264; 438/400
[58] Field of Search .......................... 437/52, 56, 57, 437/243, 58, 944, 235

[56] References Cited

U.S. PATENT DOCUMENTS

| | | | |
|---|---|---|---|
| 4,937,075 | 6/1990 | Hollingsworth et al. | 437/56 |
| 4,963,502 | 10/1990 | Teng et al. | 437/56 |
| 5,001,076 | 3/1991 | Mikkelson | 437/56 |
| 5,028,555 | 7/1991 | Haskell | 437/57 |
| 5,169,796 | 12/1992 | Murray et al. | 437/56 |
| 5,304,460 | 4/1994 | Fulton et al. | 437/243 |
| 5,328,864 | 7/1994 | Yoshizumi | 437/57 |
| 5,348,899 | 9/1994 | Dennison et al. | 437/56 |
| 5,366,921 | 11/1994 | Tashiro | 437/56 |

*Primary Examiner*—Kevin M. Picardat
*Attorney, Agent, or Firm*—Limbach & Limbach L.L.P.

[57] ABSTRACT

A Flash EEPROM memory array and method for making the same is provided. The memory array has rectangularly shaped field oxide regions. A field oxide layer is grown on a substrate having p-wells. The field oxide layer is selectively etched to provide the resulting field oxide regions. Subsequent method steps provide tunnel oxide regions, floating gates oxide-nitride-oxide layers, bit lines, oxide spacers and word lines, word line to metal dielectric, contacts, metal and passivation.

3 Claims, 8 Drawing Sheets

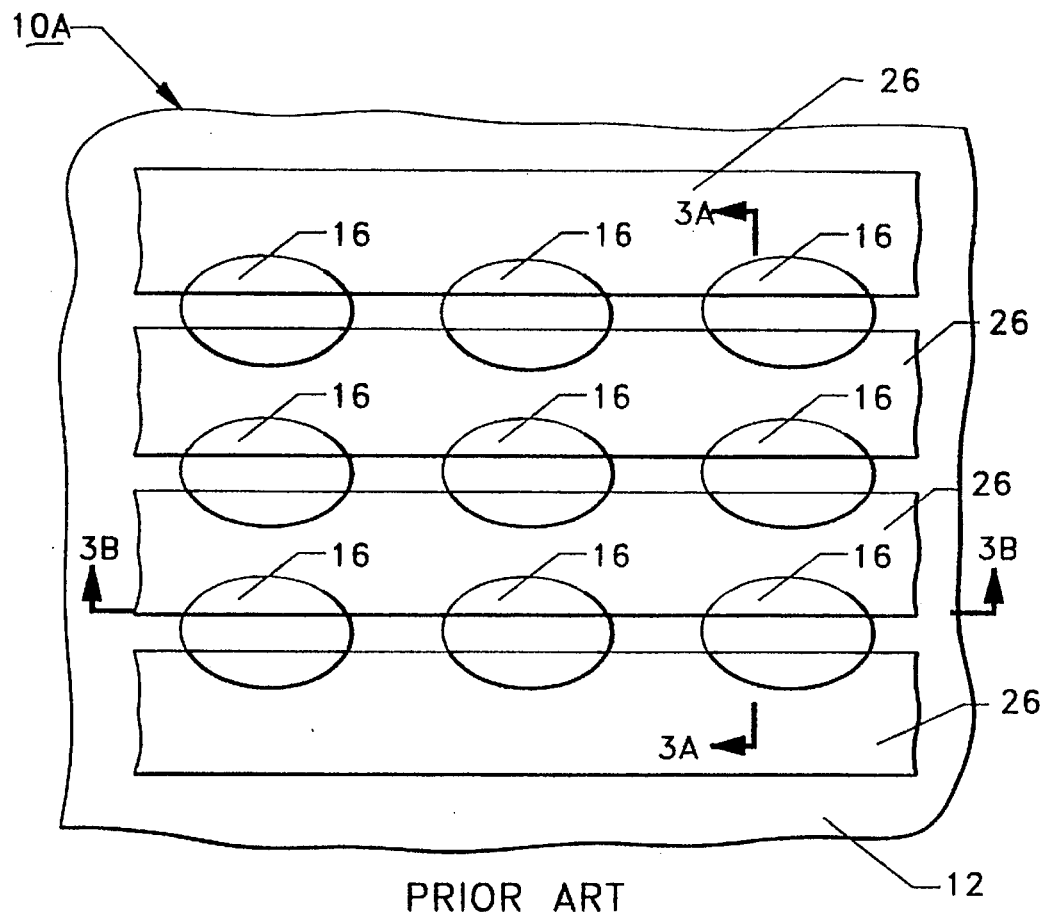
PRIOR ART
FIG. 3
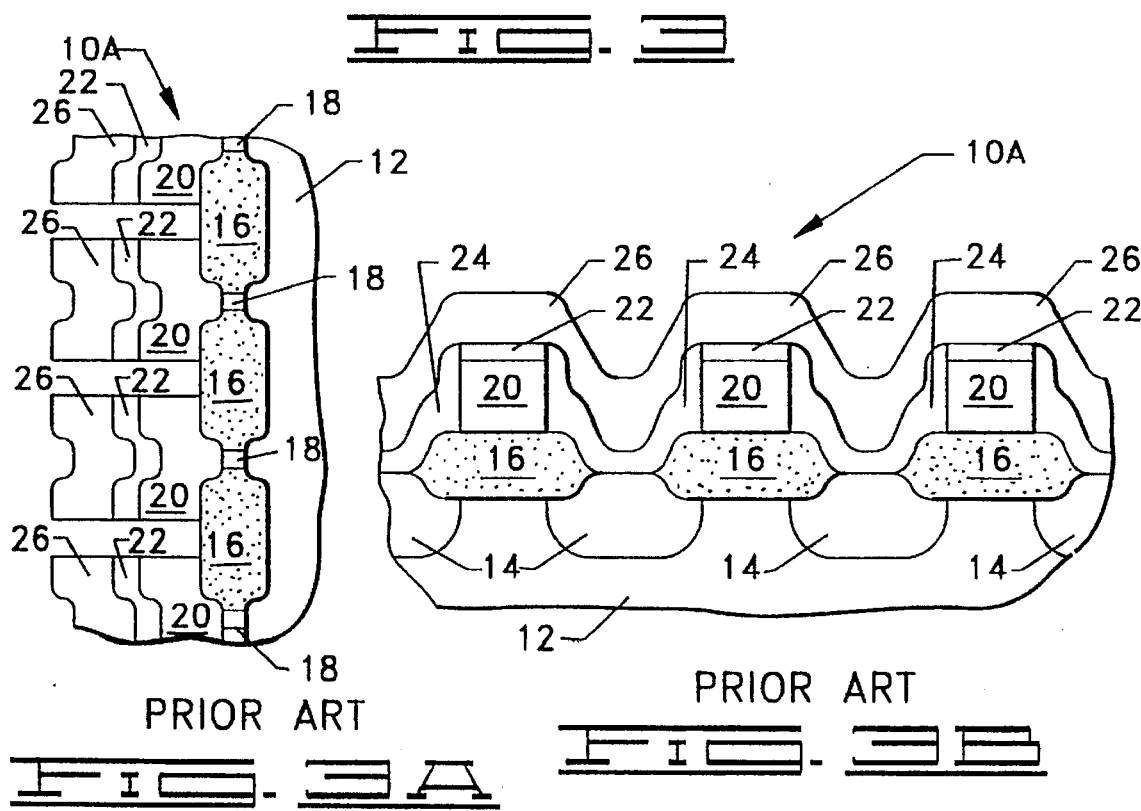
PRIOR ART
FIG. 3A
PRIOR ART
FIG. 3B

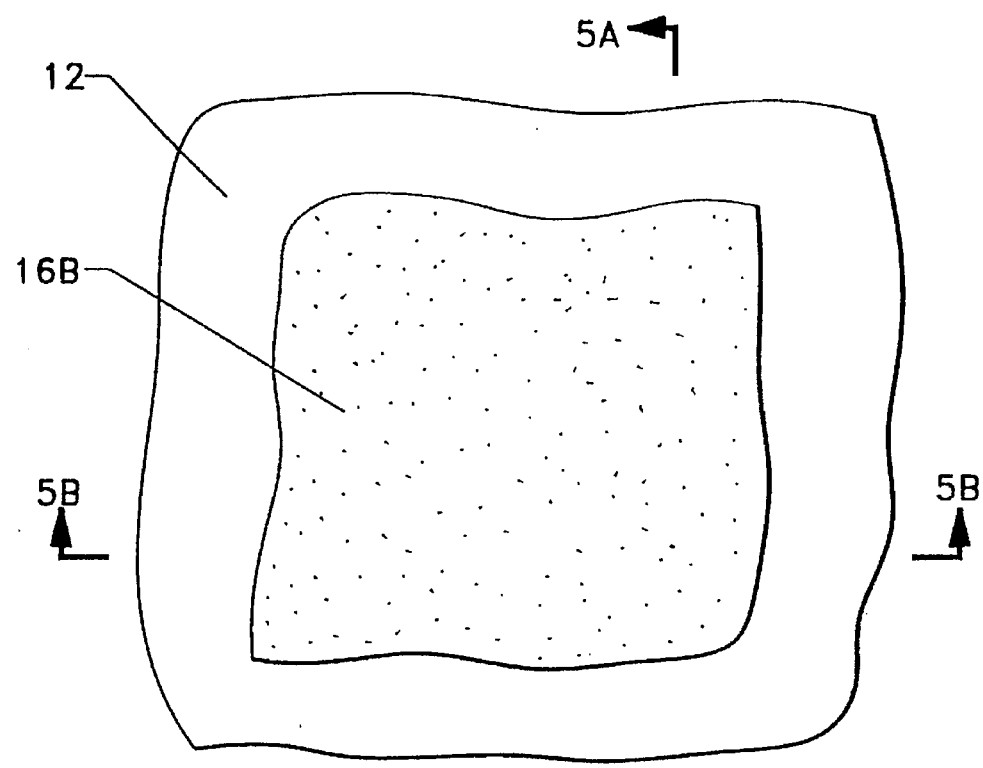
FIG. 5
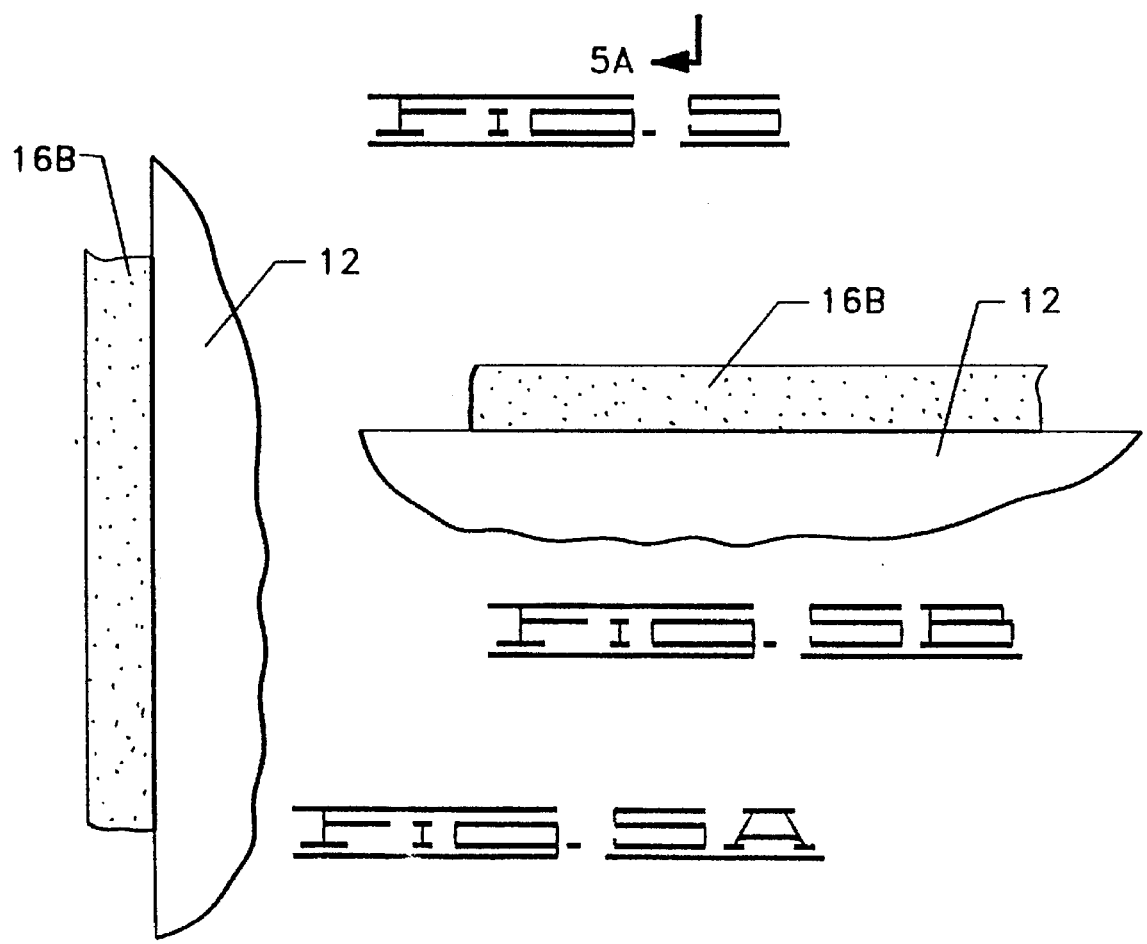
FIG. 5B
FIG. 5A

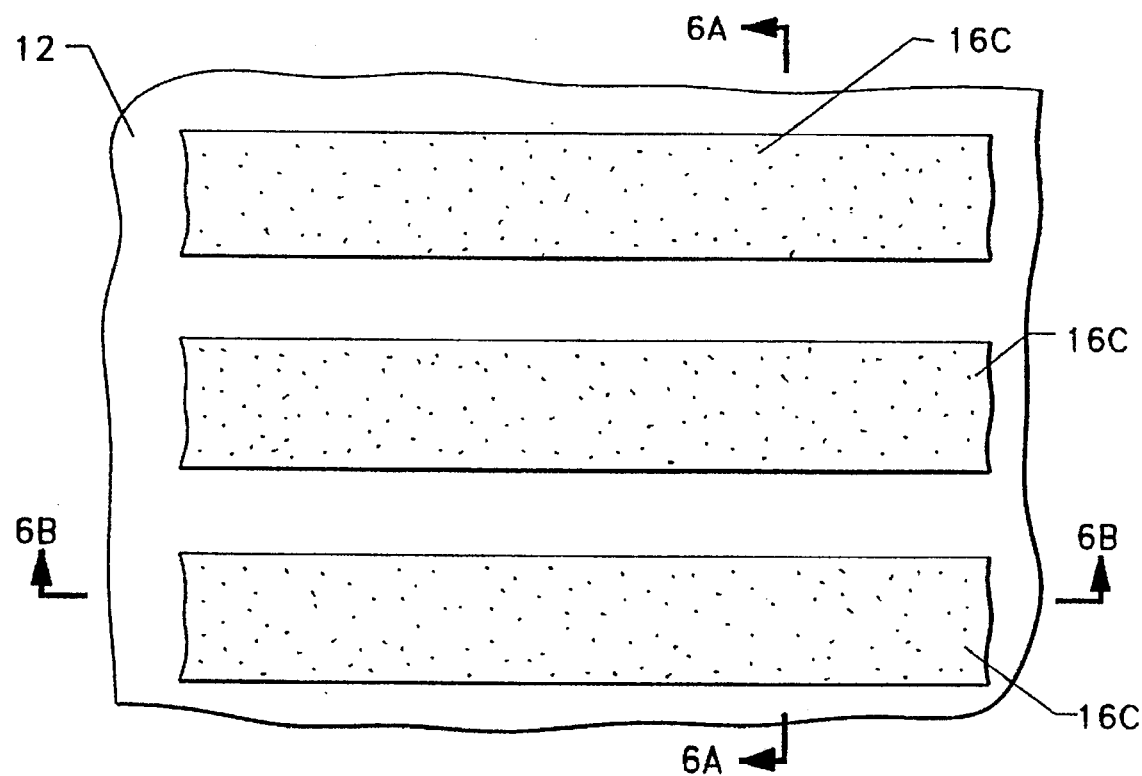
FIG. 6
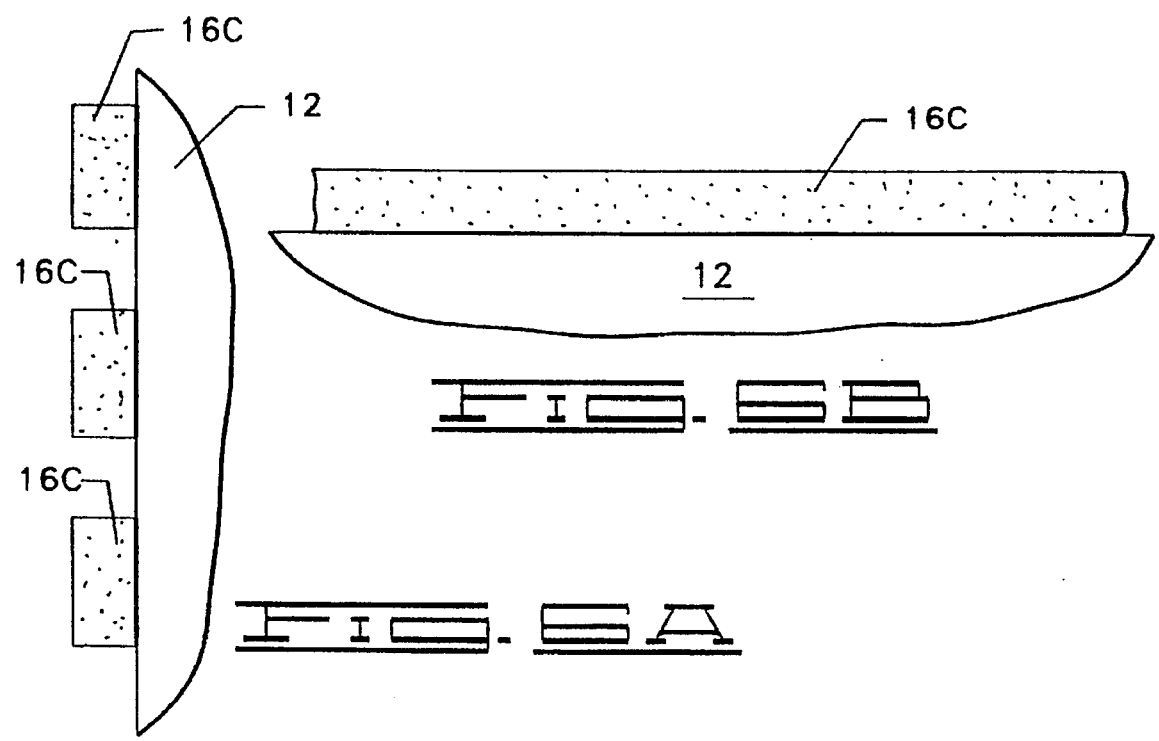
FIG. 6B
FIG. 6A

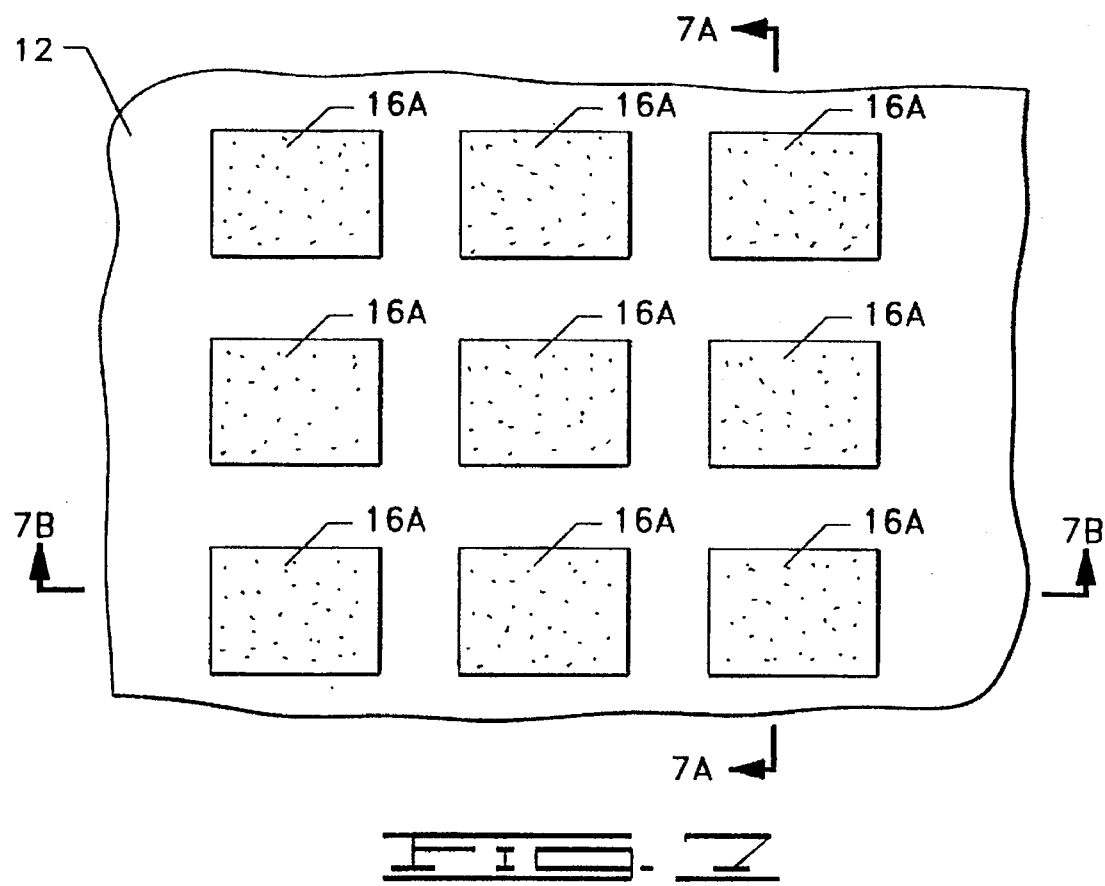
FIG. 7
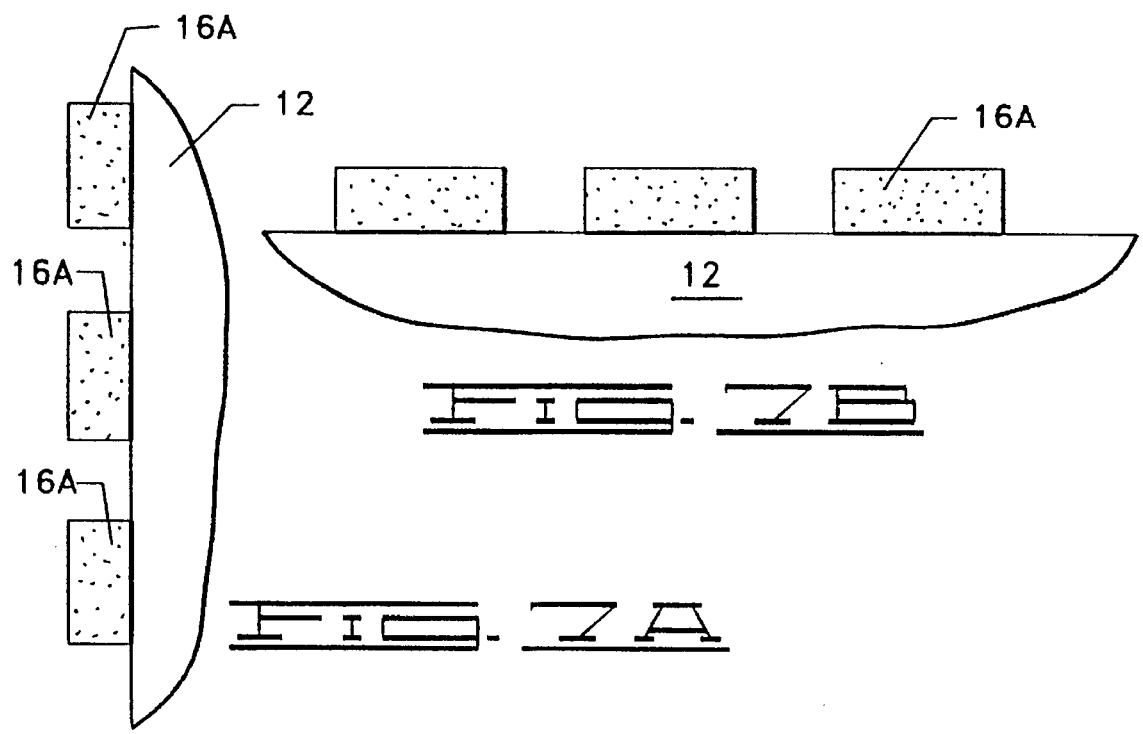
FIG. 7B
FIG. 7A

METHOD FOR FORMING FIELD OXIDE REGIONS

BACKGROUND OF THE INVENTION

1. Field of the Invention

The present invention relates to Electrically Erasable, Electrically Programmable Read Only Memories (EEPROMs), and more particularly but not by way of limitation, to an EEPROM with precise field oxide formation.

2. Discussion

An Electrically-Erasable, Electrically Programmable Read Only Memory (EEPROM) is a semiconductor device that generally uses field effect transistor memory cells with floating gate structures to store data in a memory array. A fundamental measure of an EEPROM's cost is its chip size. The smaller the chip size, the more chips can be fit onto a fixed-cost silicon wafer. Because the memory array is a large part of the total chip, shrinking the size of each memory cell transistor is one way to minimize chip size. Thus, advances in the art that improve the shape or placement of an element of a memory cell are of great commercial significance.

In current EEPROMs, including Flash EEPROMs herein, memory cells are isolated by the placement of $SiO_2$, or "field oxide," in the area surrounding a memory cell. The field oxide in typical CMOS memory technologies is formed by a process known as local oxidation of silicon (LOCOS). LOCOS is well known to have certain problems that affect the shape and placement of the field oxide. These problems include (i) the bird's head effect (recessed LOCOS); (ii) the bird's beak effect; and (iii) the white ribbon effect, commonly called the Kooi effect.

The first two of these problems are closely related. The expansion of $SiO_2$ during LOCOS causes the field oxide to deform and often buckles the edges of adjacent semiconductor layers, resulting in the bird's head and bird's beak effect. Because the deformation occurs at the edges of the field oxide, the deformation is not generally detrimental to memory cell performance where the memory cell geometries are relatively large. In modern devices with relatively small geometries, however, the detrimental effects of LOCOS field oxide deformation on memory cell performance can be significant.

Certain other problems are also inherent in the LOCOS process. For example, although the field oxide is typically designed to have rectangular sides, photolithographic effects cause the corners of the field oxide to be somewhat rounded, resulting in a field oxide with an oblong shape. Variations in the placement of masks also contribute to misalignment problems. The combination of the above effects can result in non-identical adjacent cells, resulting in a broad array erase distribution. Thus, LOCOS field oxide formation results in limitations on desired field oxide shape and placement.

In addition to the degradation of the shape and placement of the field oxide, the above problems with the LOCOS process also degrade the performance of memory cells in the array. The capacitive coupling between control gates and floating gates in the array is improved by extending the floating gate onto field oxide regions adjacent to each cell. In particular, degradation of the shape of the field oxide regions impacts the capacitive coupling ratio $K_1$ between the memory cell control gate and floating gate and the capacitive coupling ratio $K_2$ between the control gate and the drain. These important design parameters are defined by:

$K_1 = C_1/C_T$ and
$K_2 = C_3/C_T$ where
$C_T = C_1 + C_2 + C_3 + C_4 + C_5$ and
$C_1$=capacitance between control gate and the floating gate.
$C_2$=capacitance between floating gate and the source.
$C_3$=capacitance between floating gate and the drain.
$C_4$=capacitance between floating gate and the channel.
$C_5$=capacitance between floating gate and the substrate.

These capacitances are shown schematically in FIG. 1. $C_5$, the capacitance between floating gate and the substrate through the field oxide can be of importance because of the large coupling area between the floating gate and the control gate located over the field oxide. Thus, variations from the assumed values in $C_5$ can cause significant change in the key design parameters $K_1$ and $K_2$. Improving the capacitive coupling ratio $K_1$ between the control gate and the floating gate allows program and erase operations at reduced control gate voltages, and allows improved reading currents during read operations. As $K_1$ is improved, a greater percentage of the voltage applied to the control gate can be coupled to the floating gate. This relationship is represented by the equation:

$V_f = K_1 V_g$ where
$V_f$=voltage coupled to the floating gate.
$V_g$=voltage applied at the control gate.

If the field oxide is oblong, however, $K_1$ decreases, requiring a greater voltage to be applied to the control gate to achieve the same potential on the floating gate. In addition, oblong Field oxide contributes to a wide erase distribution in a memory array.

Accordingly, there is a need for an EEPROM and a process for making the same that has increased precision in the shape and placement of the field oxide regions, improves the capacitive coupling ratio for the memory cells, and tightens the intrinsic erase distribution of a memory array.

SUMMARY OF THE INVENTION

The present invention provides an EEPROM, and method of making the same, having precisely shaped and placed field oxide regions to provide memory cells with improved electrical operating characteristics. The EEPROM is made by doping a selected region of an n-type semiconductor substrate to form a p-well, followed by growing a layer of field oxide on the p-well substantially covering the p-well. The layer of field oxide is selectively etched, first in one direction and then in a second direction perpendicular to the first direction, resulting in rectangular field oxide regions arranged in rows and columns. A plurality of tunnel oxide regions are formed, covering selected areas on the p-well between the field oxide regions. A layer of poly-1 is formed over the entire wafer and the poly-1 is doped and deglazed. An oxide-nitride-oxide (ONO) layer is formed over the layer of poly-1. The layers of ONO and poly-1 are selectively etched, resulting in strips of poly-1 and ONO located over the tunnel oxide regions and columns of field oxide regions. The array region is doped to form n+bit lines running parallel to and substantially between the poly-1 strips. After a cleanup, a plurality of oxide spacers are formed substantially over the bit lines. A layer of poly-2 is formed over the entire wafer and the poly-2 is doped and deglazed. The layer of poly-2 is patterned and the poly-2 is etched to form rows of word lines. Using the same mask, the ONO and poly-1 are etched in the exposed areas between the word lines, the remaining poly-1 regions forming floating gates. The remaining process steps are then performed.

An object of the present invention is to provide an EEPROM with field oxide regions having sides rectangularly shaped, so that cells of uniform width are formed in an array of memory cells.

Another object of this invention, while achieving the above stated object, is to improve the uniformity of the capacitive coupling ratio $K_1$ between the control gate and the floating gate.

Yet another object of the present invention, while achieving the above stated object, is to improve the uniformity of the capacitive coupling ratio $K_2$ between the control gate and the drain.

Still another object of the present invention is to provide a method of forming the field oxide regions in a memory array to reduce or eliminates the problems associated with the LOCOS method.

Other objects, features and advantages of the present invention will become apparent from the following detailed description when read together with the drawings and appended claims.

BRIEF DESCRIPTION OF THE DRAWINGS

FIG. 3 is a representation of a prior art memory array realized from the partial mask set of FIG. 2.

FIG. 3A is a cross-sectional view of the prior art memory array of FIG. 3, taken along the 3A—3A line.

FIG. 3B is a cross-sectional view of the prior art memory array of FIG. 3, taken along the 3B—3B line.

FIG. 5 is a representation of a field oxide layer formed on a semiconductor substrate.

FIG. 5A is a cross-sectional view of the field oxide layer of FIG. 5, taken along the 5A—5A line.

FIG. 5B is a cross-sectional view of the field oxide layer of FIG. 5, taken along the 5B—5B line.

FIG. 6 is a representation of rows of field oxide on a semiconductor substrate.

FIG. 6A is a cross-sectional view of the rows of field oxide of FIG. 6, taken along the 6A—6A line.

FIG. 6B is a cross-sectional view of the rows of field oxide of FIG. 6, taken along the 6B—6B line.

FIG. 7 is a representation of field oxide regions constructed in accordance with the present invention.

FIG. 7A is a cross-sectional view of the field oxide regions of FIG. 7, taken along the 7A—7A line.

FIG. 7B is a cross-sectional view of the field oxide regions of FIG. 7, taken along the 7B—7B line.

DISCUSSION

Before describing the apparatus and method of the present invention, prior art LOCOS methods will be briefly discussed in greater detail in order to provide a clearer understanding of the present invention.

Figure 1:
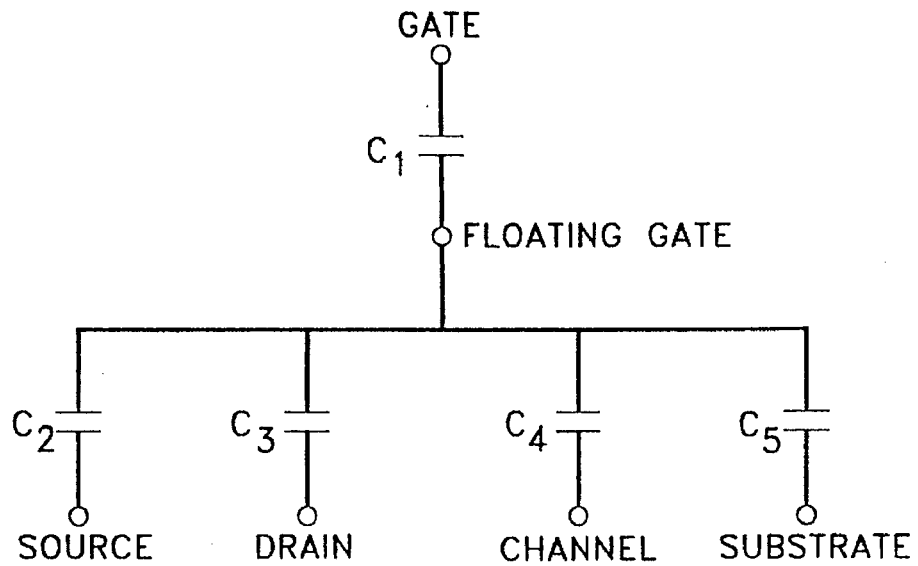
FIG. 1 is a schematic representation of various capacitances within a memory cell of the present invention.
Figure 2:
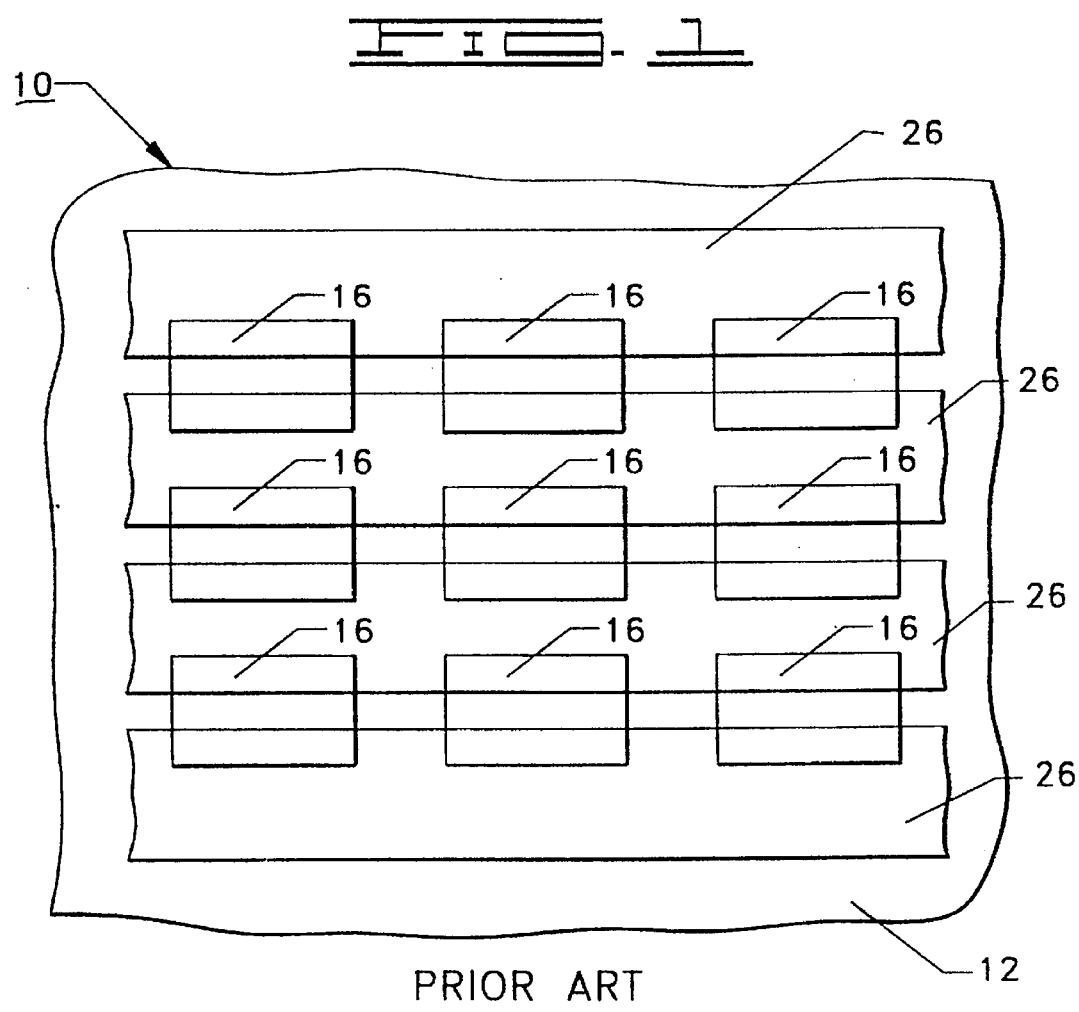
FIG. 2 is a representation of a partial mask set of a prior art memory array.

Referring to FIG. 2, shown is a partial mask set for a prior art Flash EEPROM memory array 10 from U.S. patent application Ser. No. 07/988,293 filed Dec. 8, 1992, by Albert Bergemont entitled HIGH DENSITY CONTACTLESS FLASH EPROM MEMORY ARRAY USING A CHANNEL ERASE. The Flash EEPROM memory array 10 uses LOCOS to form field oxide. The areas defined in the mask set include an n-type wafer substrate with a p-well 12, field oxide regions 16 and word lines 26. Several layers are not shown, however, including metal lines and contacts. As can be seen, the field oxide regions 16 are intended to be rectangular in shape.

FIG. 3 is a top-view representation of a prior art Flash EEPROM memory array 10A realized from the masks shown in FIG. 2. The oblong-shaped field oxide regions 16 are caused by photolithographic effects that occur during resist exposure. FIG. 3A and FIG. 3B are cross-sectional views showing various layers of the memory array 10A. Of particular note is the shape of the field oxide regions 16, which show the bird's beak effect, typical of LOCOS processing. As previously discussed, these effects limit the minimum distance between memory cells and can negatively affect memory cell performance.

Figure 4:
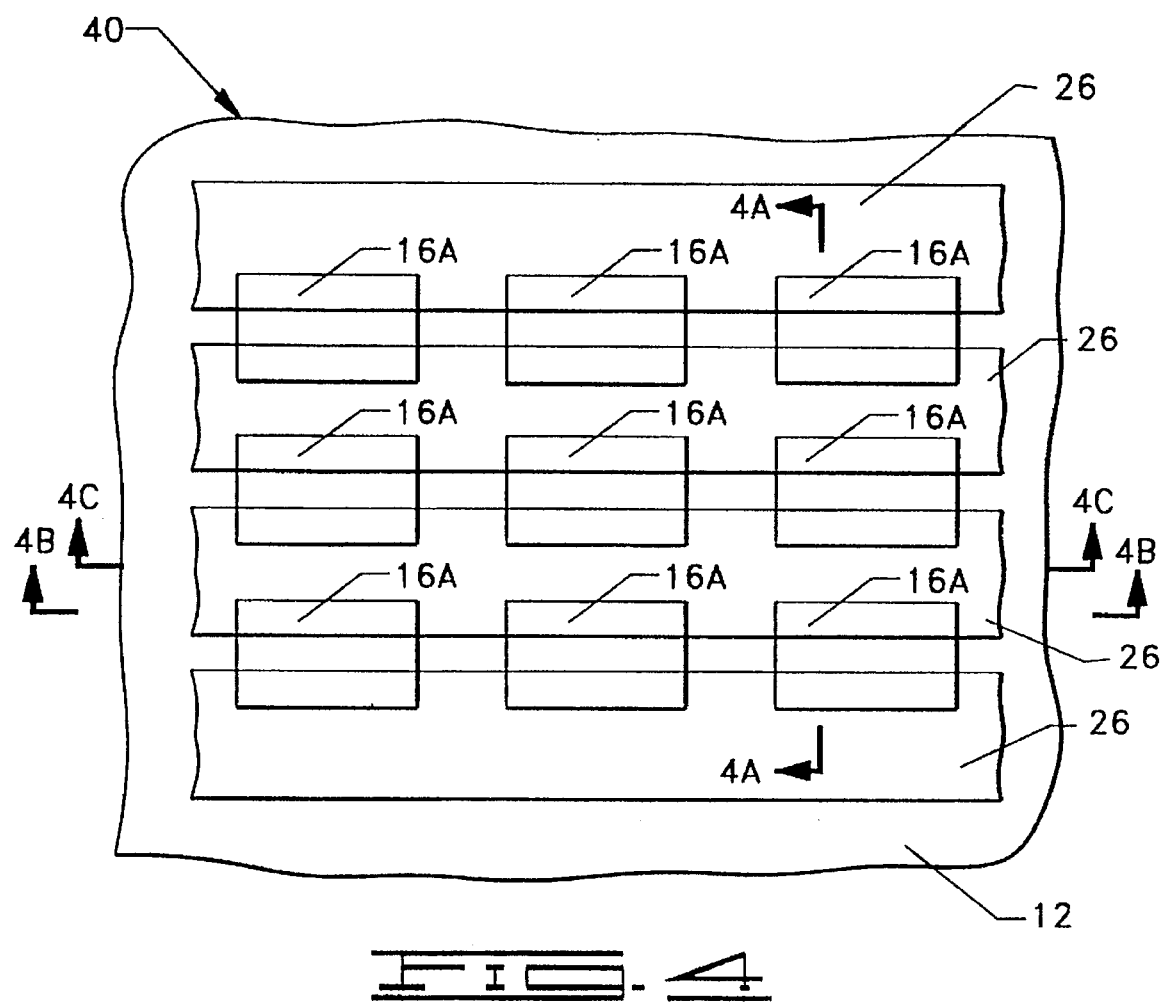
FIG. 4 is a top view representation of a memory array constructed in accordance with the present invention.
Figure 4A:
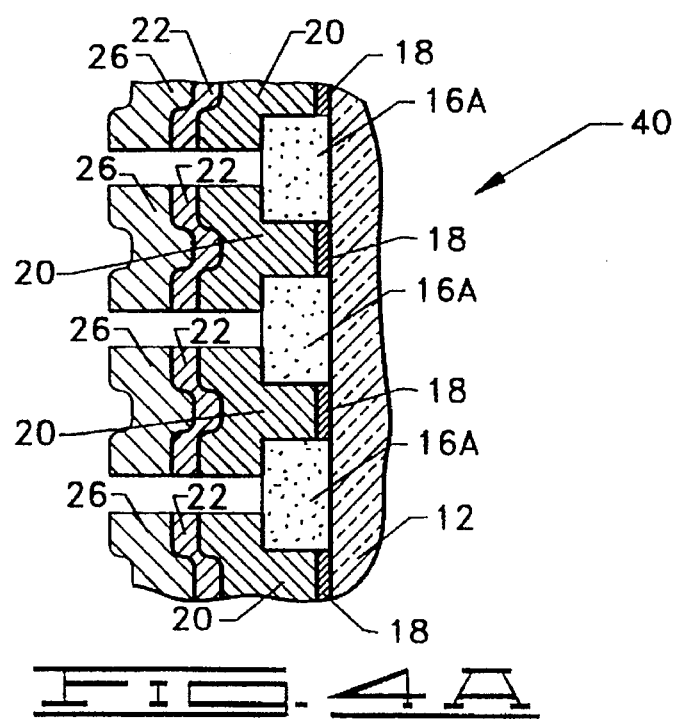
FIG. 4A is a cross-sectional view of the memory array of FIG. 4, taken along the 4A—4A line.
Figure 4B:
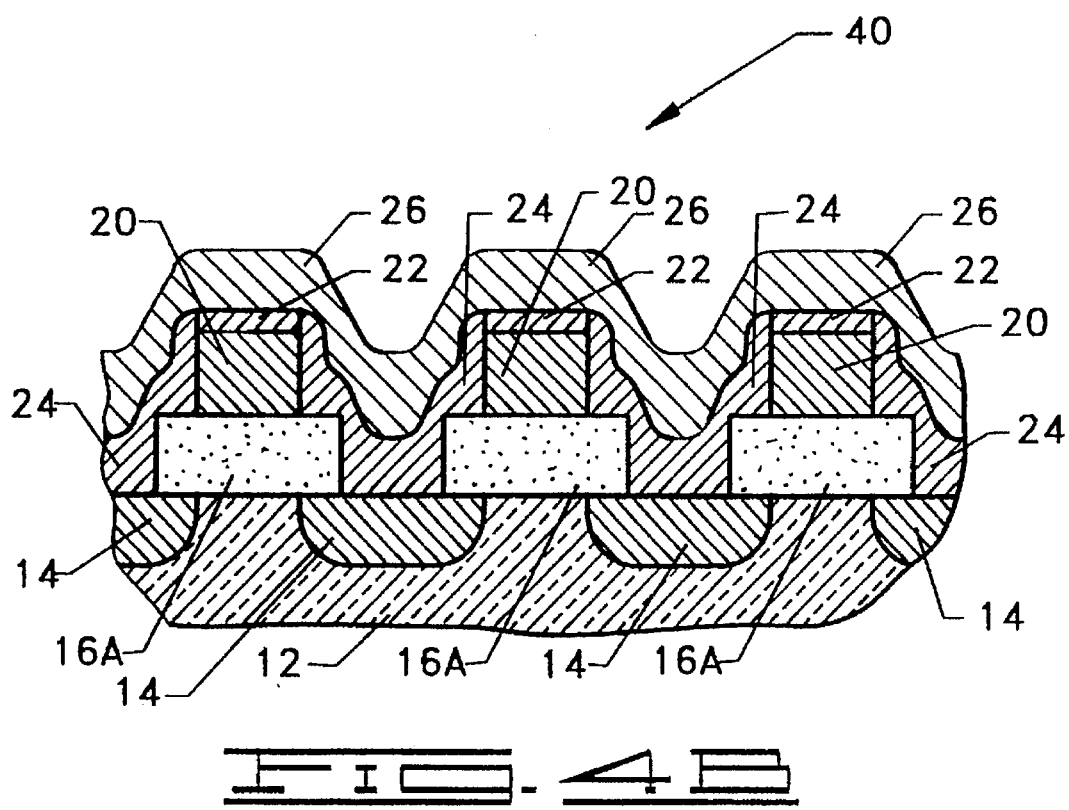
FIG. 4B is a cross-sectional view of the memory array of FIG. 4, taken along the 4B—4B line.
Figure 4C:
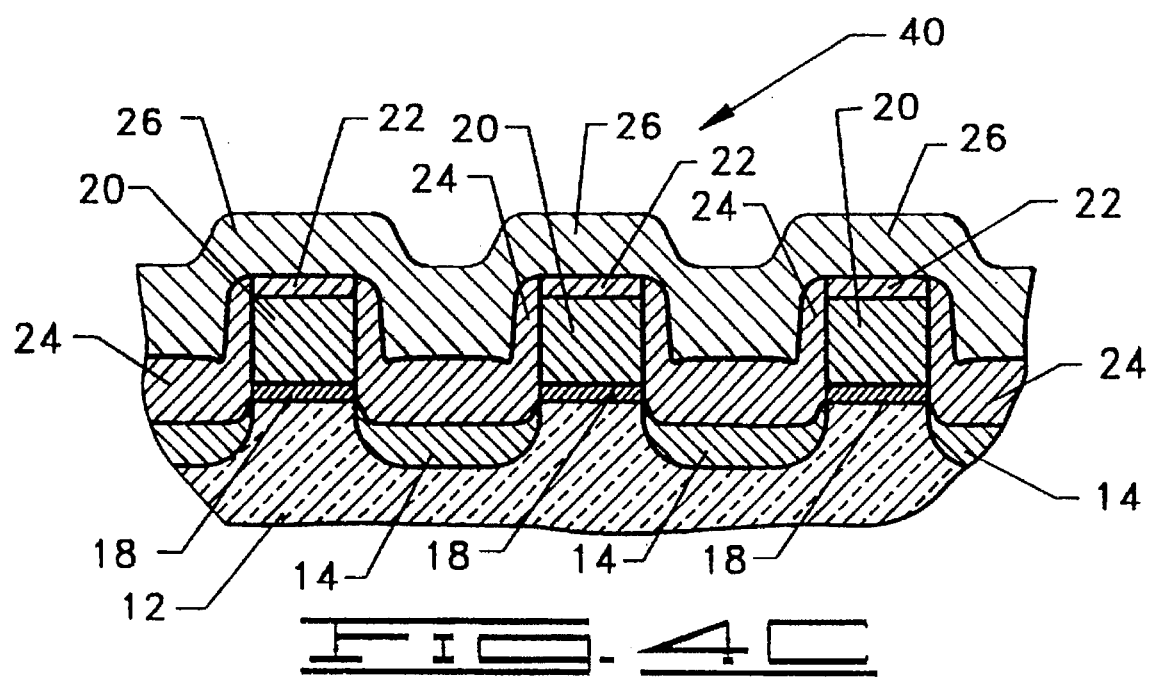
FIG. 4C is a cross-sectional view of the memory array of FIG. 4, taken along the 4C—4C line.

Turning now to the present invention, FIG. 4 represents a top-view representation of a Flash EEPROM memory array 40 having field oxide regions 16A formed in accordance with the present invention. FIG. 4A, FIG. 4B, and FIG. 4C show different cross-sections of the memory array 40.

To particularly describe the apparatus of the present invention, FIG. 4B shows an n-type substrate with a p-well 12 and with bit lines 14 running the width of the memory array 40. Field oxide regions 16A, which are rectangular in shape, are disposed between adjacent bit lines 14 and floating gates 20 are disposed over and between the field oxide regions 16A. The word line 26 is disposed above ONO layers 22, the floating gates 20, field oxide regions 16A, and bit lines 14 by way of oxide spacers 24. The word lines 26 run the length of the memory array 40 and have control gate regions formed above the floating gates 20.

FIG. 4A and FIG. 4C additionally show tunnel oxide regions 18 disposed under the floating gates 20 and between adjacent field oxide regions 16A.

To particularly describe the method of the present invention, Table I shows the major steps used in fabricating the Flash EEPROM memory array 40 in accordance with the present invention. Steps 1 and 3 through 8 are generally conventional steps used in forming Flash EEPROM memory arrays. These steps, performed as described herein in combination with step 2, provide the method of the present invention. The formation of CMOS transistors will be omitted.

TABLE I

Major Steps In Making An EEPROM Memory Cell Array

| Major Step | Predominant Function | Region |
|---|---|---|
| 1. | p-well | 12 |
| 2. | field-oxide | 16A |
| 3. | tunnel oxide | 18 |
| 4. | floating gate (poly-1) | 20 |
| 5. | ONO | 22 |
| 6. | bit line | 14 |
| 7. | word line (poly-2) | 26 |
| 8. | remaining process steps | Not shown |

In Step 1, a <100> n-type silicon wafer substrate is doped to form p-wells 12. To simplify the discussion, references to a wafer substrate should be read to include both the p-wells 12 within the wafer substrate and the remaining regions of the wafer substrate where p-wells 12 are not located.

To form the p-wells 12, appropriate masks are used to selectively implant boron at an energy of about 170 KeV and a dose of about $6 \times 10^{12}$ cm$^{-2}$ into the wafer through a previously formed oxide layer (not shown) of about 250 Å. The p-wells are driven in at about 1150 degrees Celsius for about 70 to 100 minutes. Resultant oxide (not shown) is then etched. For purposes of this discussion, references to etch steps may incorporate dry etch, wet etch, or a combination of dry etch and wet etch. For PMOS devices to be located in the periphery of the Flash EEPROM, n-wells (not shown) are formed within the p-wells 12. For reference, the p-well junction depth may be in the range of about 6 to 8 μm and the n-well junction depth may be in the range of about 3 to 5 μm.

A 250 Å pad oxide layer (not shown) is grown at about 900 degrees Celsius, followed by a composite nitride layer (not shown) with a thickness of about 2000 Å. A composite mask (not shown) is used to selectively etch the composite nitride layer. An additional mask (not shown) is used to implant boron in the array at an energy of about 30 KeV and a dose of from about 1 to $8 \times 10^{13}$ cm$^{-2}$, for channel stops. Mask resist is stripped, followed by a cleaning operation. At this point, the composite nitride layer has been etched off of the cell array region. Several variations of the channel stop implant process are possible, as is well known.

In Step 2, the field oxide regions 16A are formed. Referring to FIG. 5, FIG. 5A, and FIG. 5B, shown is a layer of field oxide 16B over the p-well 12. The layer of field oxide 16B has a thickness of from about 0.2 μm to 0.5 μm in the cell array regions. The thickness of field oxide outside the array regions may need to be different, but this will not be further discussed. The layer of field oxide 16B is selectively etched to provide the resulting field oxide regions 16A, as depicted in FIG. 4, FIG. 4A and FIG. 4B.

To selectively etch the layer of field oxide 16B, a two mask method is used, wherein the layer of field oxide 16B is first etched in one direction to form rows and then etched in a second direction perpendicular to the first direction to provide the resulting field oxide regions 16A. FIG. 6, FIG. 6A, and FIG. 6B show rows of field oxide 16C that remain after application of a first mask and an etching of the layer of field oxide 16B, as shown in FIG. 5, during the second mask etch. A second mask is applied to etch the rows of field oxide 16C to form the field oxide regions 16A, as shown in FIG. 7, FIG. 7A, and FIG. 7B. The mask and etch steps, of course, could be performed such that the first mask and etch step forms columns of field oxide instead of rows.

At the conclusion of Step 2, the field oxide regions 16A are located substantially over the p-well 12, in contrast to the LOCOS method, where the field oxide regions 16 are semi-recessed in the p-well 12, as shown in FIG. 3A and FIG. 3B. In addition, the field oxide regions 16A are rectangular in shape, in contrast to the shape of the LOCOS field oxide regions 16.

In Step 3, tunnel oxide (a first dielectric region) 18, as shown in FIG. 4A and FIG. 4C, is grown. About 400 Å of sacrificial oxide (not shown) is grown at about 900 to 1000 degrees Celsius. Using photoresist, a threshold voltage implant is performed with boron at an energy of about 30 KeV and a dose of from about $10^{12}$ to about $5 \times 10^{13}$ cm$^{-2}$. The photoresist is stripped and the sacrificial oxide is etched back. The wafer is cleaned and the tunnel oxide 18 is grown at a temperature of from about 800 to about 900 degrees Celsius to a thickness of from about 90 to about 110 Å.

In Step 4, poly-1 is deposited to a thickness of between about 1500 to 3000 Å over the entire wafer. The poly-1 is doped with an appropriate dopant, such as POCL$_3$ and the poly-1 is deglazed.

In Step 5, oxide-nitride-oxide (ONO) 22, is formed by well known methods. The bottom layer of oxide has a thickness of between about 100 to about 130 Å. The nitride layer has a thickness of about 200 Å, and the top layer of oxide has a thickness of about 40 Å. The ONO 22 is masked and etched using a suitable dry etchant. The floating gate 20 is etched by dry etch using the same mask. A hard bake is then performed.

In Step 6, the bit lines 14 are formed by implanting arsenic at an energy of about 80 KeV and a dose of about $4 \times 10^{15}$ cm$^{-2}$. The photoresist is stripped, and the wafer is cleaned. Differential oxidation is next performed by exposing the wafers to oxygen ambient at about 1000 degrees Celsius until an oxide thickness of between about 600 to 1500 Å Å is formed over the bit lines. During this oxidation, the exposed edges of the floating gate regions 16A are also oxidized, forming the oxide spacer 24.

A mask known as the array protection mask is applied and used to preferentially etch the ONO and poly-1 in the periphery. The remaining oxide is stripped by a buffered oxide etch in the periphery. Next, the resist is removed. The wafer is precleaned and low voltage oxide and high voltage oxide are formed by conventional means in the periphery for logic and high voltage CMOS.

In Step 7, a second layer of polysilicon, or poly-2, is formed at a temperature of 625 degrees Celsius to a thickness of about 2000 Å over the entire wafer. This layer of polysilicon forms the word lines 26 and also the control gate regions. The second layer of polysilicon is then doped and deglazed. Next, the wafer is precleaned and a 2500 Å thick layer of WSi$_2$ is applied. Word line masking is performed, exposing areas of unwanted WSi$_2$, poly-2, ONO and poly-1 that are then etched off, followed by removal of the photoresist and clean-up. An example of the memory cells formed as a result of the above process is shown in FIG. 4, FIG. 4A, FIG. 4B and FIG. 4C.

In Step 8, the remaining process steps are performed (not shown). An oxidation step is performed, for improving data retention. This oxidation step grows oxide on the exposed edges of WSi$_2$, poly-1, and poly-2. After this, borophosphosilicate glass (not shown) is formed with suitable planarization and reflow steps. Finally, contact, metal and protection overcoat steps are formed. All these steps are well known.

Having concluded the discussion of the method of the present invention, methods for programming, reading, and erasing memory cells in the memory array 40 are now discussed.

Figure 8:
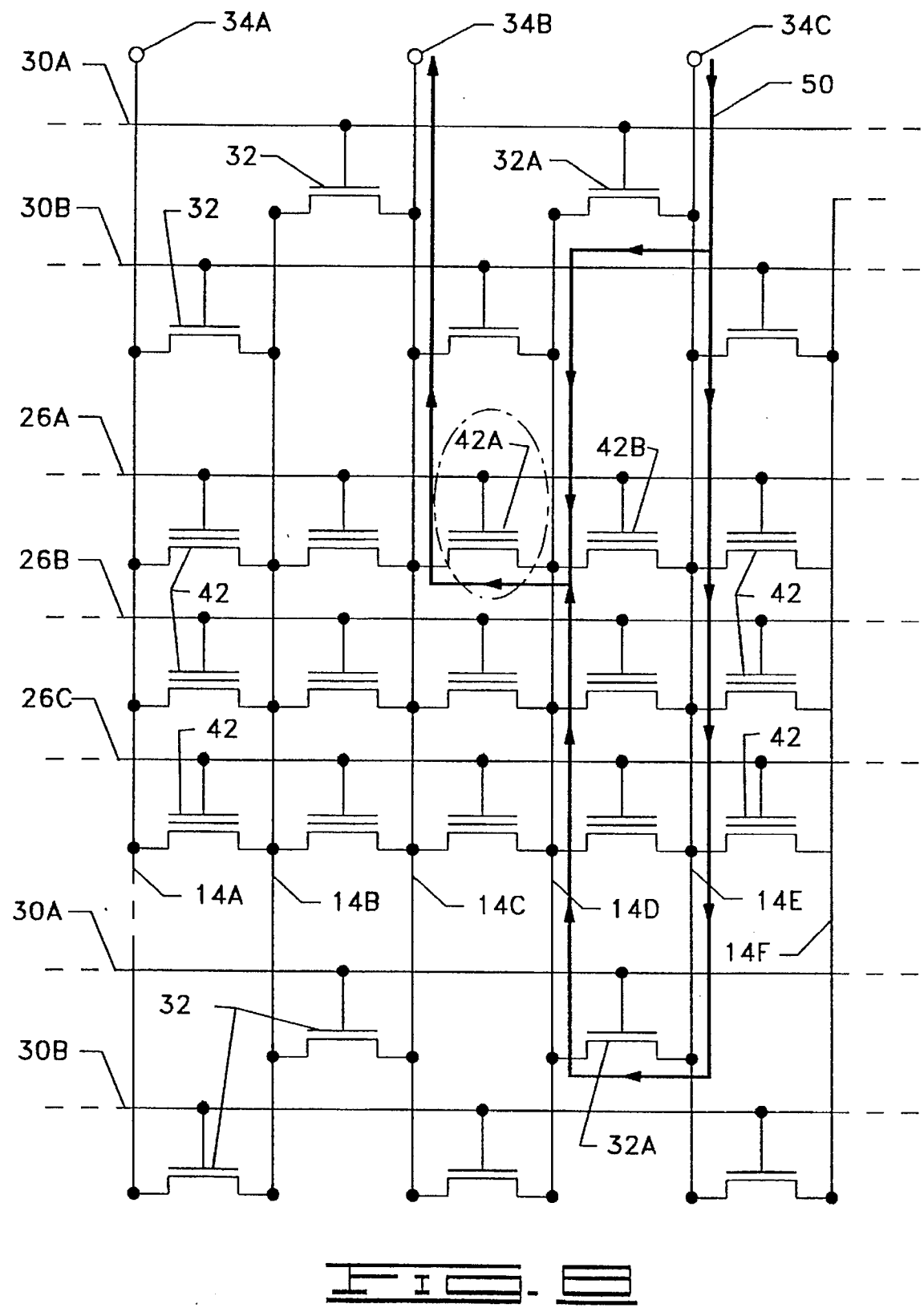
FIG. 8 is a schematic representation of a memory array of the present invention.

Referring to FIG. 8, shown is a schematic representation of a portion of the memory array 40. Word lines 26A, 26B, and 26C, drain bit lines 14A, 14C, and 14E, and source bit lines 14B, 14D, and 14F (herein "source lines") connect to memory cells 42 in the memory array 40. Both bit lines and source lines are identical, except for external connections and both are formed as previously described in Step 6 of the method description. Access to the bit lines 14A, 14C, and 14E and source lines 14B, 14D, and 14F is provided by select lines 30A and 30B and select transistors 32. The gate width of select transistors 32 is two or more times the gate width of memory cells 42 to provide low resistance paths between adjacent bit lines and source lines. The select transistors 32 can be cell transistors with wider channels than the memory cells 42, or can be single poly devices.

The select lines 30A and 30B are operated such that a source voltage, $V_{cc}$, is provided to one line and ground, $V_{SS}$, is provided to the other line in order to provide access to the memory cells 42 by way of access points 34A, 34B, and 34C. The access points 34A through 34C are used during program and read operations on the memory cells 42.

Path 50 illustrates a current path used to program and read memory cell 42A. The source voltage $V_{CC}$, perhaps 5 V, is applied to select lines 30A and select lines 30B are grounded. This turns on select transistors 32A. Path 50 thus begins at access point 34C, travels along bit line 14E, across select transistors 32A, along source line 14D, across memory cell 42A, and along bit line 14C to access point 34B. The programming current (as well as the read current) passes through and is shared by a pair of select transistors 32A.

Table II shows the appropriate voltages necessary to program, erase, and read memory cells 42 in the memory array 40.

TABLE II

| Memory Operation | Access Point 34A | Access Point 34B | Access Point 34C | Word Line 26B | Word Line 26A | Select Lines 30A | Select Lines 30B | p-well 12 | substrate |
|---|---|---|---|---|---|---|---|---|---|
| Program Cell 42A | float | $V_{PPD}$ | $V_{SS}$ | $V_{SS}$ | $V_{PP}$ | $V_{CC}$ | $V_{SS}$ | $V_{SS}$ | $V_{CC}$ |
| Program Cell 42B | float | $V_{SS}$ | $V_{PPD}$ | $V_{SS}$ | $V_{PP}$ | $V_{SS}$ | $V_{CC}$ | $V_{SS}$ | $V_{CC}$ |
| Erase Sector 26B | float | float | float | $-V_{EE}$ | $V_{CC}$ | float | float | $V_{CC}$ | $V_{CC}$ |
| Read Cell 42A | $V_{RD}$ | $V_{RD(S/A)}$ | $V_{SS}$ | $V_{SS}$ | $V_{CC}$ | $V_{CC}$ | $V_{SS}$ | $V_{SS}$ | $V_{CC}$ |
| Read Cell 42B | $V_{RD}$ | $V_{SS}$ | $V_{RD(S/A)}$ | $V_{SS}$ | $V_{CC}$ | $V_{SS}$ | $V_{CC}$ | $V_{SS}$ | $V_{CC}$ |

In Table II, program and read operations are performed on individual memory cells 42. Erase operations, however, are performed on a sector of memory cells. A sector includes all the memory cells 42 connected to the word line 26.

The voltages in Table II are $V_{cc}$, the source voltage, perhaps 5 V; $V_{SS}$, ground; $V_{pp}$, a positive programming voltage, perhaps 12 V; $-V_{EE}$, a negative programming voltage, perhaps −12 to 18 V; $V_{PPD}$, a drain voltage, perhaps 6 V; and $V_{RD}$ (S/A), a read voltage, perhaps 1–2 V: the S/A (sense amp) is connected only to the bit line containing the bit to be read. The term "float" indicates a high impedance state. Dashes "–" indicate the state does not matter.

The above description makes clear that the present invention is well-adapted to carry out the objects and to attain the ends and advantages mentioned herein as well as those inherent in the invention. While presently preferred embodiments of the invention have been described for purposes of this disclosure, numerous changes may be made which will readily suggest themselves to those skilled in the art and which are encompassed within the spirit of the invention disclosed and as defined in the claims.

What is claimed is:

1. A method of making an array of electrically erasable and programmable read-only memory cells on a face of a semiconductor substrate of a first conductivity type having wells of a second conductivity type opposite the first type, comprising:

forming a plurality of field oxide regions on the face of a well, the field oxide regions disposed in rows and columns and each field oxide region having six rectangular sides, the step of forming a plurality of field oxide regions comprising:

forming a layer of field oxide on the well;

forming a first mask on the layer of field oxide;

etching off portions of the field oxide in a first etch to leave a plurality of parallel elongated rectangles of field oxide;

forming a second mask; and etching off portions of the field oxide in a second etch, to define a plurality of field oxide regions disposed in rows and columns on the face of the substrate, each field oxide region having six rectangular sides;

forming a plurality of regions of a first dielectric on selected areas of the well between the field oxide regions and aligned along the columns of field oxide regions;

forming a first layer of polysilicon over the field oxide regions, the regions of first dielectric, and the well;

forming a layer of second dielectric over the first layer of polysilicon;

removing portions of the first layer of polysilicon and the layer of second dielectric to form a plurality of columns of dielectric and polysilicon disposed over the columns of field oxide regions;

forming a plurality of parallel bit lines of the first conductivity type in the well, the bit lines being arranged in columns disposed between the columns of field oxide regions;

forming a plurality of oxide spacers over the bit lines;

forming a second layer of polysilicon over the oxide spacers and the columns of dielectric and polysilicon;

removing portions of the second layer of polysilicon to form the plurality of word lines having a plurality of control gate regions, the word lines disposed in rows and extending over adjacent filed oxide regions in the columns of field oxide regions, each word line defining a row of memory cells; and removing portions of the column of dielectric and polysilicon disposed between the word lines to form a plurality of floating gate regions disposed under the word lines.

2. The method of claim 1 wherein the first conductivity type is n-type and the second conductivity type is p-type.

3. A method of forming field oxide regions on the face of a semiconductor substrate, comprising:

forming a layer of field oxide on the substrate;

forming a first mask over the layer of field oxide;

etching off portions of the field oxide in a first etch to leave a plurality of parallel elongated rectangles of field oxide;

forming a second mask; and etching off portions of the field oxide in a second etch, to define a plurality of field oxide regions disposed in rows and columns on the face of the substrate, each field oxide region having six rectangular sides.

\* \* \* \* \*